(12) United States Patent
Bremer et al.

(10) Patent No.: US 10,601,451 B1
(45) Date of Patent: Mar. 24, 2020

(54) LOW-COST METHOD FOR SELECTIVELY REDUCING SWITCH LOSS

(71) Applicant: MOTOROLA MOBILITY LLC, Chicago, IL (US)

(72) Inventors: Brian H. Bremer, Arlington Heights, IL (US); John R. Mura, Clarendon Hills, IL (US); Armin Klomsdorf, Chicago, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 16/460,375

(22) Filed: Jul. 2, 2019

(51) Int. Cl.
*H04B 1/26* (2006.01)
*H04B 5/00* (2006.01)
*H04B 1/00* (2006.01)
*H05K 1/02* (2006.01)

(52) U.S. Cl.
CPC ........... *H04B 1/006* (2013.01); *H05K 1/0237* (2013.01); *H05K 1/0292* (2013.01)

(58) Field of Classification Search
None
See application file for complete search history.

(56) References Cited

U.S. PATENT DOCUMENTS

| | | | | |
|---|---|---|---|---|
| 7,639,990 B2 * | 12/2009 | Morioka | ................ | H04B 1/406 455/127.1 |
| 7,962,104 B1 * | 6/2011 | Wilz | ...................... | H04B 1/109 455/101 |
| 8,543,059 B2 * | 9/2013 | Hsiao | ...................... | H04B 1/48 455/41.1 |
| 8,781,522 B2 * | 7/2014 | Tran | ........................ | H01Q 1/22 343/745 |
| 9,055,485 B2 * | 6/2015 | Liu | ..................... | H04W 28/22 |
| 9,136,612 B2 * | 9/2015 | Kwon | ................... | H01Q 21/28 |
| 9,190,699 B2 * | 11/2015 | Granger-Jones | ......... | H01P 1/15 |
| 9,231,680 B2 * | 1/2016 | Gorbachov | ............. | H04B 1/48 |
| 9,673,843 B2 * | 6/2017 | Jeong | ................... | H04B 1/0064 |
| 9,991,065 B2 * | 6/2018 | Khlat | ................... | H01H 1/0036 |
| 10,237,050 B2 * | 3/2019 | Khlat | ................... | H04L 5/1461 |
| 10,270,485 B2 * | 4/2019 | Sugaya | ................ | H04B 1/0057 |
| 10,298,288 B2 * | 5/2019 | Khlat | ........................ | H01P 1/15 |
| 10,381,736 B2 * | 8/2019 | Jung | ......................... | H01Q 3/30 |
| 10,382,009 B2 * | 8/2019 | Nosaka | .................... | H03H 7/38 |
| 10,432,235 B2 * | 10/2019 | Thompson | ........... | H04B 1/0057 |
| 10,498,521 B2 * | 12/2019 | Little | ................... | H04B 1/0064 |

\* cited by examiner

*Primary Examiner* — Tuan A Tran
(74) *Attorney, Agent, or Firm* — Yudell Isidore PLLC (57) ABSTRACT

A method includes providing a radio frequency front end (RFFE) switch including a single pole input terminal and a number (N) of output terminals. Each of the N output terminals is a component of a respective one of N throws of the RFFE switch, with N being greater than one. The N output terminals include a first output terminal corresponding to a first throw of the N throws and at least one additional output terminal not connected to any radio frequency (RF) band path. The at least one additional output terminal includes a second output terminal corresponding to a second throw of the N throws. The method includes connecting the first output terminal to a single RF band path. The method includes forming a parallel connection between the single pole input terminal and the single RF band path. The parallel connection provides at least two parallel branches for routing RF signals being transceived between the single pole input terminal and the single RF band path.

18 Claims, 5 Drawing Sheets

LOW-COST METHOD FOR SELECTIVELY REDUCING SWITCH LOSS

BACKGROUND

1. Technical Field

The present disclosure generally relates to electronic device architecture for radio frequency communications s, and more particularly to low-cost methods for selectively reducing switch loss within electronic devices engaged in radio frequency communications.

2. Description of the Related Art

Mobile communication devices are typically equipped with a printed circuit board (PCB) that includes a radio frequency front end (RFFE) that transmits and receives radio frequency (RF) signals via one or more antenna(s). Different geographical regions require wireless communication systems to use different RF bands for cellular communication. For example, North America uses a subset of RF bands that is different from the subset of RF bands used in South America, and different from the subset of RF bands used in Asia. A smartphone manufacturer will often release different variants of a single product (e.g., smartphone) so that each variant is configured to support a different subset of RF bands based on the different geographical regions of the world where the product is sold to an end user (assuming regional use). The term "SKU" is commonly used to refer to a variant of a single product, and means a given configuration of a product that ships to a certain region.

Current smartphone design practices entail designing a single-product PCB that is used worldwide, in every geographical region in which the smartphone operates. That is, all variants of the single product have the same identical PCB. The single-product PCB includes, within the RFFE, an antenna switch that can accommodate the full number of bands supported across all SKUs. Components not required in a given SKU will not be populated, which leaves unused switch throws. An unused switch throw is an example of excess hardware.

Year after year, the number of RF bands required in smartphones continues to increase. In order to accommodate the multitude of RF bands required in smartphones, the RFFE includes a high throw-count switch that is placed near the antenna. The insertion loss of this high throw-count switch has a positive correlation with the number of RF bands supported by the single-product PCB. This high throw-count switch is used as the antenna switch of the single-product PCB.

BRIEF DESCRIPTION OF THE DRAWINGS

The description of the illustrative embodiments is to be read in conjunction with the accompanying drawings. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Disclosed are a radio frequency front end (RFFE) switch configured for selectively reducing switch loss, a communication device with the configured RFFE switch, and a method for configuring the RFFE switch. The method includes providing the RFFE switch including a single pole input terminal and a number (N) of output terminals. Each of the N output terminals is a component of a respective one of N throws of the RFFE switch, with N being greater than one. The N output terminals include a first output terminal corresponding to a first throw of the N throws and at least one additional output terminal not connected to any radio frequency (RF) band path. The at least one additional output terminal includes a second output terminal corresponding to a second throw of the N throws. The method includes connecting the first output terminal to a single RF band path. The method includes forming a parallel connection between the single pole input terminal and the single RF band path. The parallel connection provides at least two parallel branches for routing RF signals being transceived between the single pole input terminal and the single RF band path. According to one aspect of the method, forming the parallel connection includes, placing a jumper that connects the first output terminal to at least the second output terminal, and closing the first throw and the second throw.

According to another embodiment, an RFFE switch includes a single pole input terminal. The RFFE switch includes a number (N) of output terminals. Each of the N output terminals is a component of a respective one of N throws of the RFFE switch, where N is greater than one. The N output terminals include a first output terminal corresponding to a first throw of the N throws that connects to a single radio frequency (RF) band path, and at least one additional output terminal not connected to any RF band path. The at least one additional output terminal includes a second output terminal corresponding to a second throw of the N throws. The RFFE switch includes a parallel connection formed between the single pole input terminal and the single RF band path. The parallel connection provides at least two parallel branches for routing RF signals being transceived between the single pole input terminal and the single RF band path.

According to another embodiment, a communication device includes a printed circuit board (PCB) including a number (N) of radio frequency (RF) signal paths for transmitting and receiving RF signals within respective single RF bands. The communication device includes a radio frequency front end (RFFE) switch positioned on and connected to the PCB. The RFFE switch includes a single pole input terminal. The RFFE switch includes a number (N) of output terminals. Each of the N output terminals is a component of a respective one of N throws of the RFFE switch, wherein N is greater than one. The N output terminals include a first output terminal corresponding to a first throw of the N throws that connects to a single radio frequency (RF) band path, and at least one additional output terminal not connected to any RF band path. The at least one additional output terminal includes a second output terminal corresponding to a second throw of the N throws. The RFFE switch includes a parallel connection formed between the single pole input terminal and the single RF band path. The parallel connection provides at least two parallel branches for routing RF signals being transceived between the single pole input terminal and the single RF band path.

As a technical advantage, by utilizing a throw(s) of the RFFE switch that corresponds to a depopulated RF band path(s), embodiments of the present disclosure overcome a problem of increased insertion loss resulting from increased quantity of RF bands supported by the single-product PCB, and the embodiments both reduce insertion loss and repurpose excess hardware.

In the following description, specific example embodiments in which the disclosure may be practiced are described in sufficient detail to enable those skilled in the art to practice the disclosed embodiments. For example, specific details such as specific method sequences, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "alternate embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various aspects are described which may be aspects for some embodiments but not other embodiments.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be provided its broadest interpretation given the context in which that term is utilized.

Those of ordinary skill in the art will appreciate that the hardware components and basic configuration depicted in the following figures may vary. For example, the illustrative components within the presented devices are not intended to be exhaustive, but rather are representative to highlight components that can be utilized to implement the present disclosure. For example, other devices/components may be used in addition to, or in place of, the hardware depicted. The depicted example is not meant to imply architectural or other limitations with respect to the presently described embodiments and/or the general disclosure.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

Figure 1:
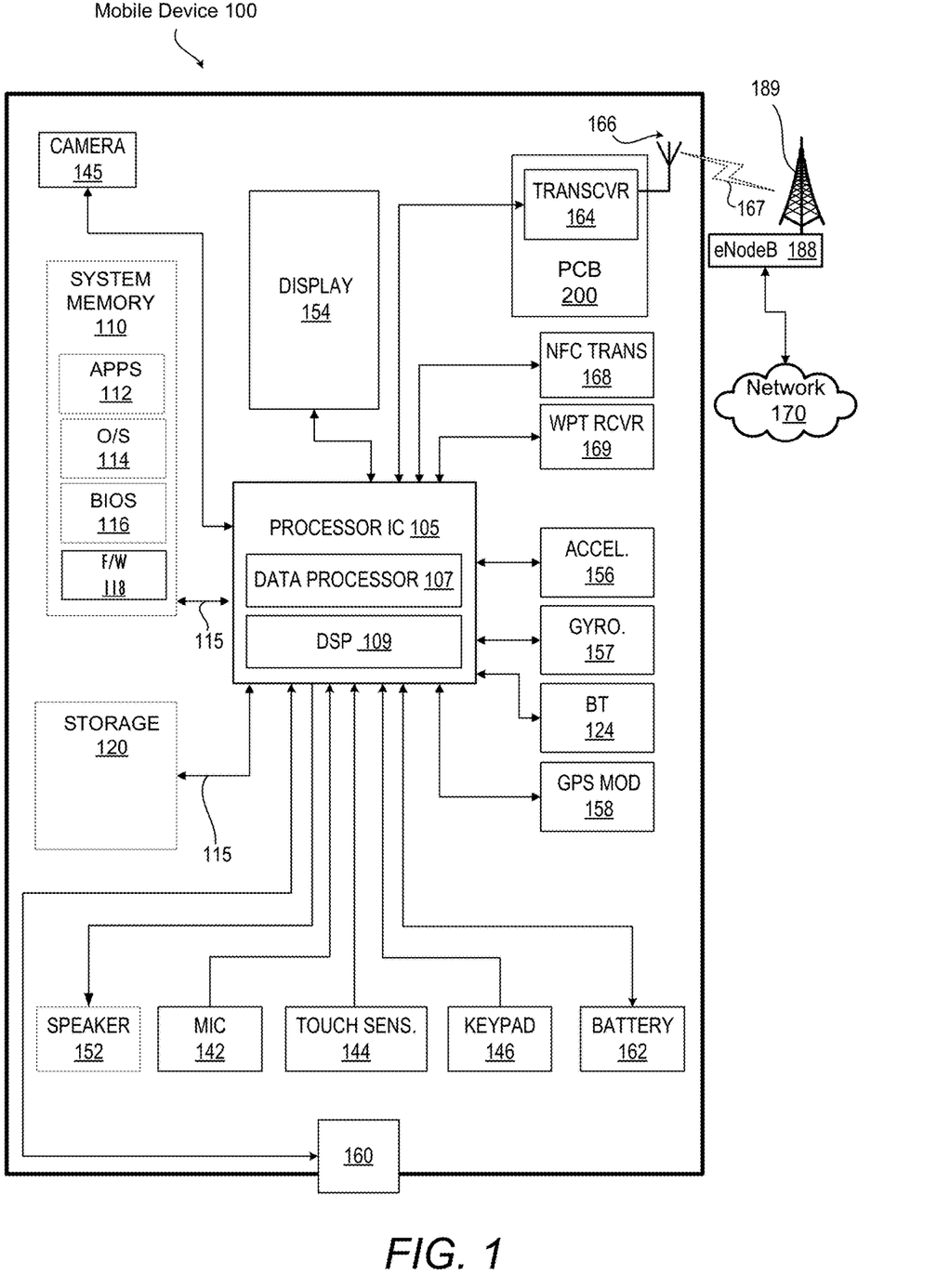
FIG. 1 is a block diagram representation of an example mobile device within which certain aspects of the disclosure can be practiced, in accordance with one or more embodiments of this disclosure.

FIG. 1 illustrates a block diagram representation of a mobile device 100, within which one or more of the described features of the various embodiments of the disclosure can be implemented. Mobile device 100 may be a handheld device a notebook computer, a mobile phone, a digital camera, a tablet computer, or any other suitable device, and may vary in size, shape, performance, functionality, and price.

Example mobile device 100 includes at least one processor integrated circuit (IC), processor IC 105. Included within processor IC 205 are data processor 107 and digital signal processor (DSP) 109. Processor IC 205 is coupled to system memory 110 and non-volatile storage 220 via an intersystem communication fabric, such as system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown).

As shown, system memory 110 can include therein a plurality of software and/or firmware modules including application(s) 112, operating system (O/S) 114, basic input/output system/unified extensible firmware interface (BIOS/UEFI) 116, and other firmware (F/W) 118. System memory 120 may be a combination of volatile and non-volatile memory, such as random access memory (RAM) and read-only memory (ROM). That is, system memory 110 can store program code or similar data associated with applications 112, O/S 114, BIOS/UEFI 116, and firmware 118. The software and/or firmware modules provide varying functionality when their corresponding program code is executed by processor IC 205 or by secondary processing devices within mobile device 100.

In some embodiments, storage 120 can be a hard drive or a solid-state drive. The one or more software and/or firmware modules within storage 120 can be loaded into system memory 110 during operation of DPS 100. The various software and/or firmware modules have varying functionality when their corresponding program code is executed by processor IC 105 or other processing devices within DPS 100.

Processor IC 105 supports connection by, and processing of signals from, one or more connected input devices such as microphone 142, touch sensor 144, camera 145, and keypad 146. Processor IC 105 also supports connection by and processing of signals to one or more connected output devices, such as speaker 152 and display 154. Additionally, in one or more embodiments, one or more device interfaces 160, such as an optical reader, a universal serial bus (USB), a card reader, Personal Computer Memory Card International Association (PCMIA) slot, and/or a high-definition multimedia interface (HDMI), can be associated with mobile device 100. In at least one embodiment, device interfaces 160 can be utilized to enable data to be read from or stored to additional devices (not shown) for example a compact disk (CD), digital video disk (DVD), flash drive, or flash memory card. These devices can collectively be referred to as removable storage devices, and are examples of non-transitory computer readable storage media. Mobile device 100 also contains a power source such as a battery 162 that supplies power to mobile device 100.

Mobile device 100 further includes Bluetooth transceiver 124, accelerometer 156, global positioning system module (GPS MOD) 158, and gyroscope 157, all of which are communicatively coupled to processor IC 105. Bluetooth transceiver 124 enables mobile device 100 and/or components within mobile device 100 to communicate and/or interface with other devices, services, and components that are located external to mobile device 100. GPS MOD 158 enables mobile device 100 to communicate and/or interface with other devices, services, and components to send and/or receive geographic position information. Gyroscope 157 communicates the angular position of mobile device 100 using gravity to help determine orientation. Accelerometer 156 is utilized to measure non-gravitational acceleration and enables processor IC 105 to determine velocity and other measurements associated with the quantified physical movement of a user.

Mobile device 100 is presented as a wireless communication device. As a wireless device, mobile device 100 can transmit data over wireless network 170. Mobile device 100 includes a single product printed circuit board, PCB 200, that is described more particularly below with reference to FIG. 2. PCB (200) includes transceiver 164. Transceiver 164 is communicatively coupled to processor IC 105 and to antenna 166. Transceiver 164 allows for wide-area or local wireless communication, via wireless signal 167, between mobile device 100 and evolved node B (eNodeB) 188, or other base station, which includes antenna 189. Mobile device 100 is capable of wide-area or local wireless communication with other mobile wireless devices or with eNodeB 188 as a part of a wireless communication network. Mobile device 100 communicates with other mobile wireless devices by utilizing a communication path involving transceiver 164, antenna 166, wireless signal 167, antenna 189, and eNodeB 188. Mobile device 100 additionally includes near field communication transceiver (NFC TRANS) 168 and wireless power transfer receiver (WPT RCVR) 169. In one embodiment, other devices within mobile device 100 utilize antenna 166 to send and/or receive signals in the form of radio waves. For example, GPS module 158 can be communicatively couple to antenna 166 to send/and receive location data.

By transmitting data over wireless network 170, mobile device 100 communicates and/or interfaces, via the communication network, with other devices, services, and components that are located external (remote) to mobile device 100. These devices, services, and components can interface with mobile device 100 via an external network, such as example network 170, using one or more communication protocols. Network 170 can be a local area network, wide area network, personal area network, signal communication network, and the like, and the connection to and/or between network 170 mobile device 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Figure 2:
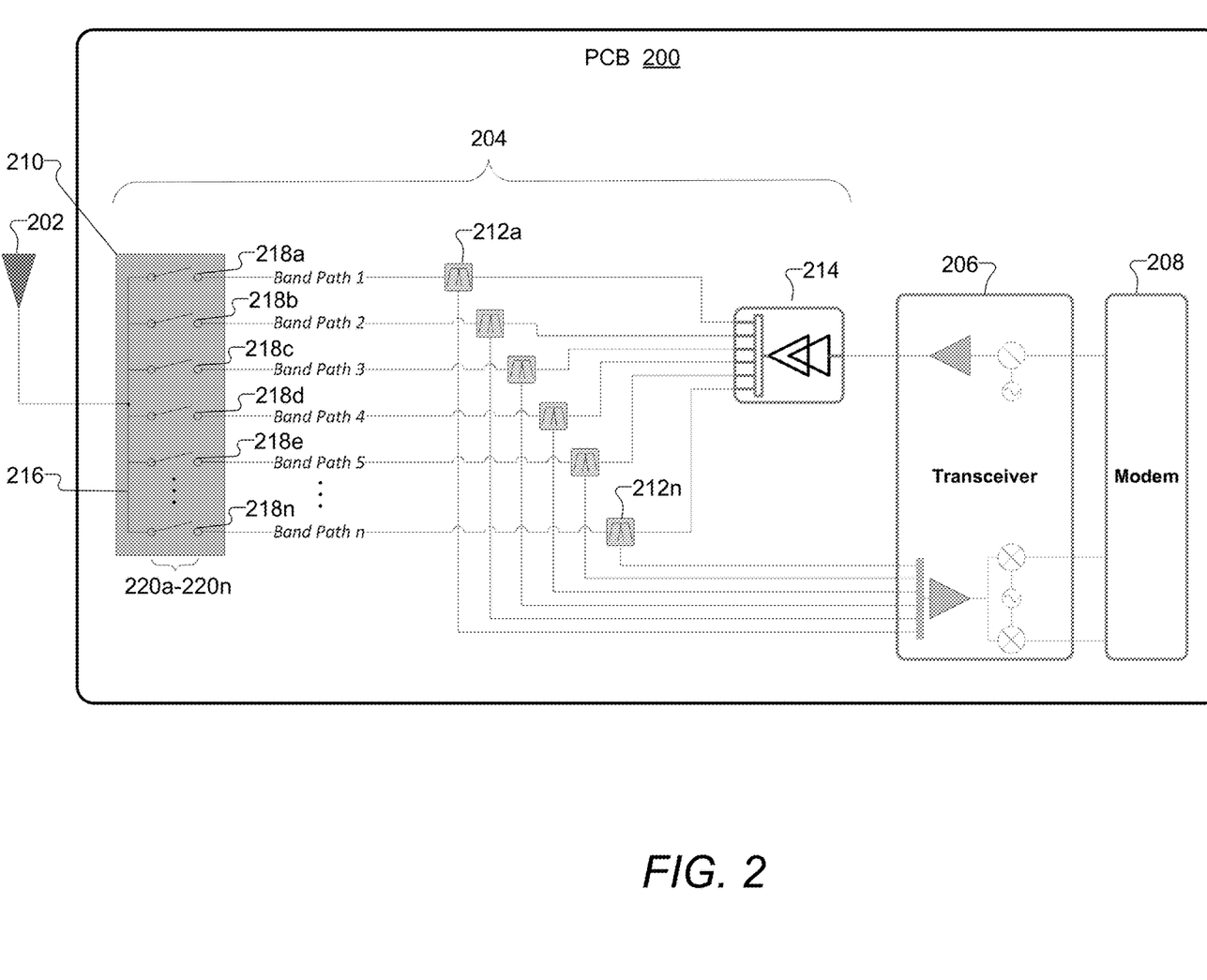
FIG. 2 illustrates a single product printed circuit board (PCB) that is populated with components required for worldwide geographical regions and that includes a full-band antenna switch, in accordance with one or more embodiments of this disclosure.

In the description of the following figures, reference is also occasionally made to specific components illustrated within the preceding figures, utilizing the same reference numbers from the earlier figures. With reference now to FIG. 2, there is illustrated example single product PCB 200 that exists within mobile device 100. Technologies described in this disclosure with respect to PCB 200 may be applied to various communications systems, for example, 2G/3G/4G/5G communications systems, and a next generation communications system, for example, a Global System for Mobile Communications (GSM) system, a Code Division Multiple Access (CDMA) system, a Time Division Multiple Access (TDMA) system, a Wideband Code Division Multiple Access (WCDMA) system, a Frequency Division Multiple Access (FDMA) system, an Orthogonal Frequency-Division Multiple Access (OFDMA) system, a single-carrier FDMA (SC-FDMA) system, a General Packet Radio Service (GPRS) system, a Long Term Evolution (LTE) system, LTE-Advanced system, and other communications systems.

In LTE technology, duplex modes are classified into two types: Frequency Division Duplex (FDD) and Time Division Duplex (TDD). In the FDD mode, different frequencies are used in uplink and downlink channels, and frames of fixed time lengths are used for both uplink transmission and downlink transmission. In the TDD mode, uplink transmission and downlink transmission are performed in different timeslots, and usually share a same frequency. Compared with FDD, TDD has characteristics of high frequency utilization and flexible uplink and downlink resource configuration.

As shown in FIG. 2, the circuitry of mobile device 100 includes PCB 200 and an antenna 202. Multiple components are positioned on and connected to PCB 200, including components such as RFFE 204, transceiver 206, and modem 208. Within example mobile device 100 (FIG. 1), RFFE 204 is positioned near the antenna 202. PCB 200 includes a number (N) of single RF signal paths for transmitting and receiving RF signals within respective single-carrier RF signal transmission/reception channels.

Antenna 202 enables modem 208 to transmit one or more RF signals through a radio channel and to receive one or more RF signals through a radio channel.

RFFE 204 connects antenna 202 to a modem 208. RFFE 204 implements radio frequency transmission and reception in the above-listed types of communications systems, for example, in an LTE system in a case of inter-band carrier aggregation (CA). In order for mobile device 100 to perform reception functions, RFFE 204 receives a radio signal from a radio channel, converts the radio signal into a baseband analog signal, and sends the baseband analog signal to the baseband processor within modem 208. In order for mobile device 100 to perform transmission functions, RFFE 204 receives a baseband analog signal from the baseband processor, converts the baseband analog signal into a radio signal, and transmits the radio signal to a radio channel. RFFE 204 includes RFFE switch 210, a power amplifier 214, and band-pass filter 212a-212n. Each band-pass filter 212a-212n is linked to a respective one of the single RF band paths among the full number (N) of RF bands that is collectively used in all of the various geographical regions of the world (i.e., all SKUs).

RFFE switch 210 is sometimes referred to as a full-band antenna switch. More particularly, RFFE switch 210 supports the full number (N) of RF bands that the LTE Protocol has assigned worldwide. In the embodiment shown in FIG. 2, RFFE switch 210 is implemented as a single-pole multi-throw switch, commonly referred to as a single-pole N-throw (SPNT) switch. An SPNT switch includes a single pole input terminal 216 and N output terminals 218a-218n, in which each of the N output terminals 218a-218n is a component of a respective one of N throws 220a-220n of the SPNT switch. The number N is greater than one, and as a non-limiting example, RFFE switch 210 shown in FIG. 2 includes six (6) throws 220a-220n (i.e., N=6). In at least one other embodiment, RFFE switch 210 is implemented as multiple SPNT switches. RFFE switch 210 selects which of the RF bands that antenna 202 uses to transmit or receive signals.

Input terminal 216 is connected to antenna 202. Input terminal 216 enables all of the N throws 220a-220n to be connected to antenna 202 at the same time.

Each of the output terminals 218a-218n corresponds to a throw that connects the input terminal 216 to a corresponding band path from among the full number (N) of RF band paths (shown in FIG. 2 as Band Path 1 through Band Path n). Each of the full number (N) of RF band paths includes one of the N output terminals 218a-218n being connected to a respective one of the N band-pass filters 212a-212n. First output terminal 218a corresponds to a first throw 220a that connects to Band Path 1 of PCB 200. Second output terminal 218b corresponds to a second throw 220b that connects to Band Path 2 of PCB 200.

Each of band-pass filters 212a-212n corresponds to a specific one of the full number (N) of RF bands paths. According to one aspect, each output terminal 218a can be associated with one LTE single-carrier band. For example, first band-pass filter 212a corresponds to a first LTE single-carrier band, second band-pass filter 212b corresponds to a second LTE single-carrier band, and $N^{th}$ band-pass filter 212n corresponds to an $N^{th}$ LTE single-carrier band. First band-pass filter 212a only allows frequencies that are within the first LTE single-carrier band to pass through from power amplifier 214 to RFFE switch 210 during transmission of RF signals. Similarly, first band-pass filter 212a only allows frequencies that are within the first LTE single-carrier band to pass through from RFFE switch 210 to transceiver 206 during reception of RF signals. Analogously, second band-pass filter 212b only allows frequencies that are within the second LTE single-carrier band to pass through, and blocks other frequencies that are outside the second LTE single-carrier band.

Power amplifier 214 amplifies low power RF signals outputted from transceiver 206 to a higher power level that can be successfully transmitted to (i.e., received by) a base station (e.g., eNodeB 188 of FIG. 1). Power amplifier 214 supports the full number (N) of RF bands. That is, power amplifier 214 can receive low power RF signals from transceiver 206 and output higher power RF signals to the N band-pass filters 212a-212n.

Transceiver 206 performs frequency up-conversion of signals received at antenna 202 and performs frequency down-conversion of signals to be transmitted from antenna 202.

Modem 208 includes a baseband processor (not shown), which processes baseband signals in radio communication. Modem 208 performs modulation and demodulation, enabling mobile device 100 to transmit and receive data wirelessly via a radio channel.

Single-product PCB 200 can support various regional SKUs, each SKU being a configuration that supports communications within a subset of RF bands associated with a certain geographical region of the world. For example, the single-product PCB 200 supports a full number of RF bands that is collectively used in all of the various geographical regions of the world; However, a first SKU only uses a first subset of RF bands, while a second SKU only uses a second subset of RF bands. PCB 200 is designed to include an RFFE switch 210 that supports whichever geographical region that requires the most (i.e., highest quantity) of RF bands. PCB 200 includes RFFE switch 210 that supports the most bands on any given SKU, although some SKUs will not require all of those RF bands. So, within a given SKU, the single-product PCB 200 can be populated with only the components required for a given geographical region.

The insertion loss of RFFE switch 210 is primarily a factor of the resistance of the switch implementation. That is, the resistance (i.e., $R_{throw}$, measured in ohms) between input terminal 216 and one of the output terminals 218a-218n represents the resistance across one of the throws 220a-220n in the closed position. In the switch implementation shown in FIG. 2, each one of the throws 220a-220n represents a respective circuit branch emanating from the commonly shared input terminal 216. The power of an RF signal that is lost between the two terminals of one of the throws 220a-220n is a directly proportional to the resistance ($R_{throw}$) across the throw.

During operation, such as a transmission over a single-carrier RF signal transmission channel, RFFE switch 210 exhibits high insertion loss. The insertion loss of this high throw-count RFFE switch 210 directly impacts output power, receive sensitivity, and current consumption of mobile device 100 (FIG. 1). The transmission power level of RF signals output by antenna 202 is decreased directly by insertion loss of RFFE switch 210. The insertion loss exhibited by RFFE switch 210 increases in direct proportion with increases in the full number of RF bands that PCB 200 supports, and the insertion loss directly impacts the output power of the mobile device 100. That is, if the full number (N) of RF bands increases, then the number (N) of throws within RFFE switch 210 increases, which, in turn, results in greater insertion loss.

Figure 3A:
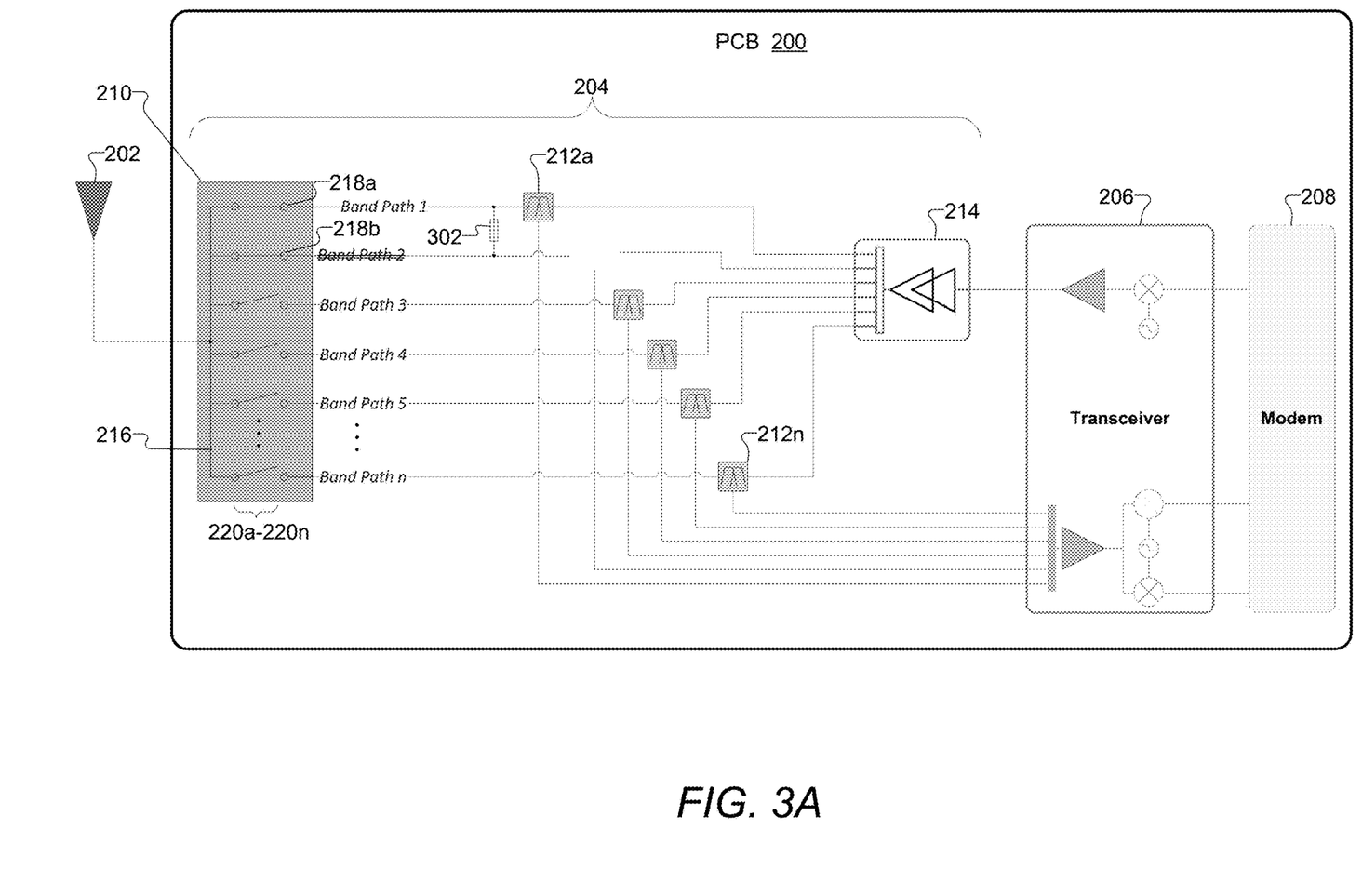
FIGS. 3A and 3B illustrate two examples of the single-product PCB of FIG. 2 that is configured to include only components required to support RF bands for a particular geographical region and that has been modified according to the low-cost methods for selectively reducing switch loss, in accordance with one or more embodiments of this disclosure.
Figure 3B:
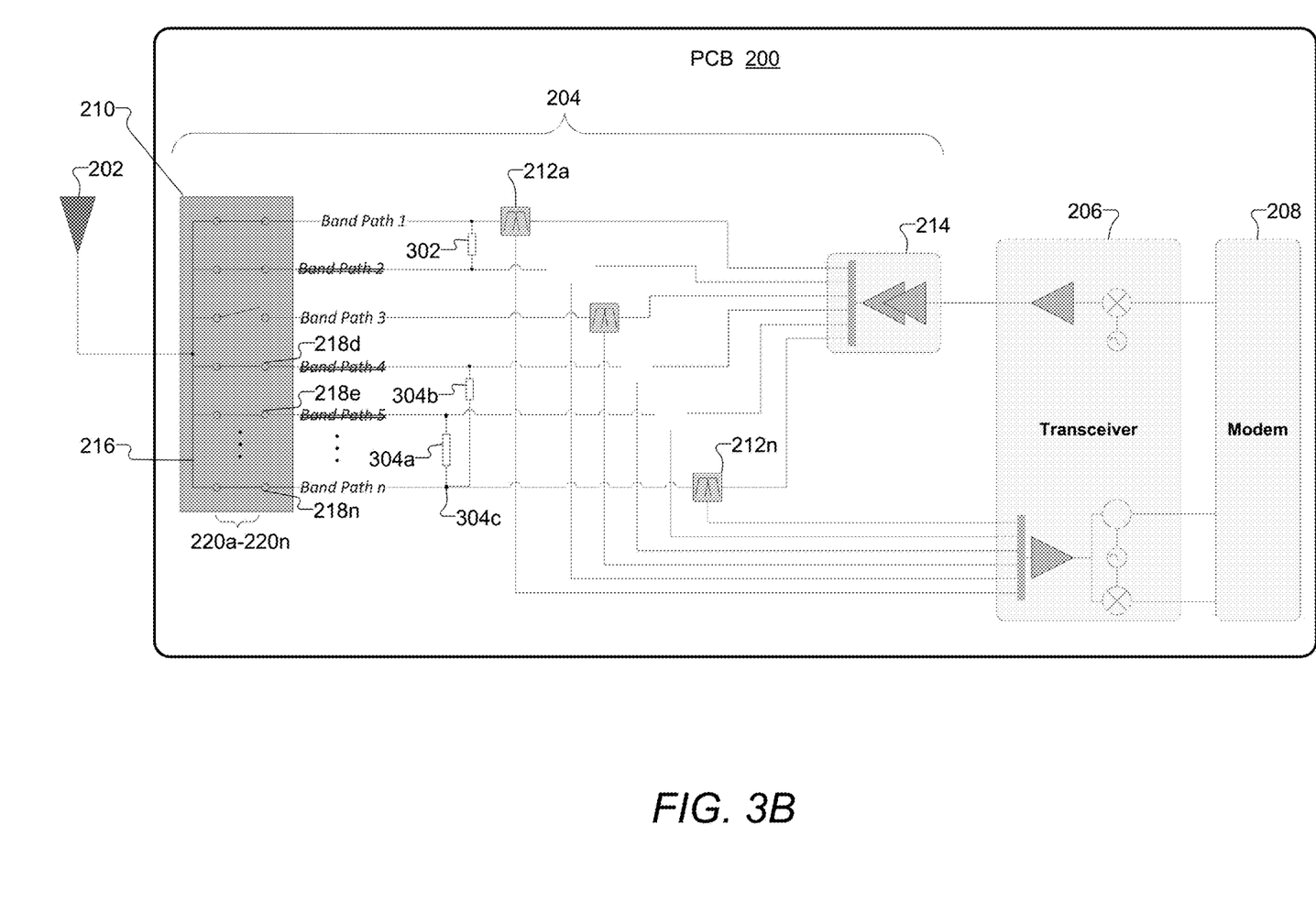

With reference now to FIGS. 3A and 3B, there are illustrated two examples of the single-product PCB 200 of FIG. 2 that is configured to include only components required to support RF bands for a particular geographical region and that has been modified according to the low-cost methods for selectively reducing switch loss, in accordance with one or more embodiments of this disclosure. The configurations of PCB 200 in FIGS. 3A and 3B show techniques that enable PCB 200 to support a lower insertion loss on a RF band path that is used for communication in the SKU by taking advantage of the fact that certain SKUs do not use certain RF band paths. In FIG. 3A, PCB 200 is configured to include components required to support the first RF band and the third through $N^{th}$ RF bands, but not second RF band. That is, FIG. 3A illustrates an example configuration of PCB 200 for a first SKU. In FIG. 3B, PCB 200 is configured to include components required to support the first RF band, third RF band, and $N^{th}$ RF band, but not the second, fourth, and fifth RF bands. That is, FIG. 3B illustrates an example configuration of PCB 200 for a second SKU. It is understood that the configurations of the first and second SKUs of FIGS. 3A and 3B can be applied in any wireless communication system. As a particular example in an LTE Protocol system, in order to configure PCB 200 for placement within a North America SKU product, components required to support LTE band 41, band 7, and band 30 would be populated on the PCB, but no components would be populated for band 40. In North America, LTE band 40 is not required for wireless communication systems. As another example, in order to configure PCB 200 for placement within a China SKU product, components required to support LTE band 40, band 7, and band 41 would be populated on the PCB, but no components would be populated for band 30. In China, LTE band 30 is not required for wireless communication systems. Single-product PCB design accommodates all of the different geographical SKUs.

As shown in FIG. 3A, PCB 200 is modified for placement into a mobile device that is configured according to requirements of the first SKU. As the first SKU does not require communications over the second RF band, PCB 200 is modified by depopulating (e.g., removing) second band-pass filter 212b. As a result of depopulating second band-pass filter 212b, Band Path 2 is eliminated (illustrated by double strike-through style text). That is, second throw 220b (including second output terminal 218b) is not connected to any band-pass filter, and thus is not connected to any RF band path.

PCB 200 is modified to form a parallel connection between input terminal 216 and Band Path 1 at first output terminal 218a. In forming the parallel connection, one end of jumper 302 is connected to first output terminal 218a, another end of jumper 302 is connected to second output terminal 218b, and first throw 220a and send throw 220b are closed. As an example, jumper 302 could be a zero (0) ohm resistor, a series resonant capacitor, a parallel resonant inductor, or any suitable shunt connector. In at least one embodiment, first throw 220a and send throw 220b are actuated at the same time to transition from an open position to a closed position. In another embodiment, the first throw 220a and send throw 220b may be actuated separately to commence transition from the open position to the closed position at different times, but to remain in the closed position concurrently. The parallel connection provides at least two parallel branches for routing RF signals being transmitted from or received at input terminal 216 and Band Path 1. One of the parallel branches includes input terminal 216 at one end, first throw 220a in the closed position, and at the other end, both jumper 302 and first output terminal 218a. The other parallel branch includes input terminal 216 at one end, second throw 220b in the closed position, and at the other end, both jumper 302 and second output terminal 218b.

The insertion loss of RFFE switch 210 is primarily a factor of the resistance of the switch implementation. In the switch implementation shown in FIGS. 3A and 3B, each one of the throws 220a-220n represents a respective circuit branch emanating from the commonly shared input terminal 216, such that when a parallel connection is formed between two of the throws 220a and 220b, the parallel connection (i.e., between input terminal 216 and first output terminal 218a) exhibits an equivalent resistance ($R_{EQ}=R_{throw}/2$) that is half of the resistance ($R_{throw}$) of one closed throw. During operation, such as during a transmission over single-carrier RF signal transmission channel associated with Band Path 1, RFFE switch 210 of FIG. 3A, which is modified according to the low-cost methods for selectively reducing switch loss, exhibits a reduced insertion loss. The reduced insertion loss is a result of the approximately 50% reduction in resistance.

As shown in FIG. 3B, PCB 200 is modified for placement into a mobile device that is configured according to requirements of the second SKU. As the second SKU does not require communications over the second, fourth, and fifth RF bands, PCB 200 is modified by depopulating second band-pass filter 212b, fourth band-pass filter 212d, and fifth band-pass filter 212e. Band Path 2, Band Path 4, and Band Path 5 are eliminated (illustrated by double strike-through style text) as a result of depopulating the above listed three band-pass filters 212b, 212d, and 212e. That is, second, fourth, and fifth throws 220b, 220d, and 220e are not connected to any band-pass filter, and thus are not connected to any RF band path.

PCB 200 is modified to form a first parallel connection between input terminal 216 and Band Path 1 at first output terminal 218a, as described above with reference to jumper 302 of FIG. 3A. Further, PCB 200 is modified to form a second parallel connection between input terminal 216 and Band Path n at $N^{th}$ output terminal 218n. The second parallel connection can be formed in a variety of ways. According to one embodiment, the second parallel connection is formed by: connecting one end of a two-terminal jumper 304b or 304a (respectively) to $N^{th}$ output terminal 218n; connecting the other end of jumper 304a to an additional output terminal of RFFE switch 210 (i.e., fourth output terminal 218d or fifth output terminal 218e, respectively) not connected to any RF band path; closing $N^{th}$ throw 220n; and closing the throw (i.e., fourth throw 220d or fifth throw 220e, respectively) corresponding to the additional output terminal of RFFE switch 210. According to another embodiment, the second parallel connection is formed by: connecting one terminal of a multi-terminal jumper 304c (together 304a and 304b) to $N^{th}$ output terminal 218n; connecting other terminals of jumper 304c to multiple additional output terminals of RFFE switch 210 (i.e., fourth output terminal 218d and fifth output terminal 218e); closing $N^{th}$ throw 220n; and closing the throws (i.e., fourth throw 220d and fifth throw 220e) corresponding to the multiple additional output terminals of RFFE switch 210. The second parallel connection provides at least two parallel branches for routing RF signals being transmitted from or received at input terminal 216 and Band Path n. One of the parallel branches includes input terminal 216 at one end, $N^{th}$ throw 220n in the closed position, and at the other end, both $N^{th}$ output terminal 218n and jumper 304a, 304b, or 304c. The second parallel branch includes input terminal 216 at one end, fifth throw 220e in the closed position, and at the other end, both fifth output terminal 218e and jumper 304a or 304c. The third parallel branch includes input terminal 216 at one end, fourth throw 220d in the closed position, and at the other end, both fourth output terminal 218d and jumper 304b or 304c.

When the second parallel connection (i.e., between input terminal 216 and $N^{th}$ output terminal 218n) includes three parallel branches, the second parallel connection exhibits an equivalent resistance ($R_{EQ}=R_{throw}/3$) that is one-third of the resistance ($R_{throw}$) of one closed throw. During a transmission over a single-carrier RF signal transmission channel, RFFE switch 210 of FIG. 3B, which is modified according to the low-cost methods for selectively reducing switch loss, exhibits a reduced insertion loss. The reduced insertion loss is a result of the approximately 331/4% reduction in resistance.

Carrier Aggregation (CA) technology is a key technology in LTE, and is used to implement aggregation of carriers at two frequencies. Generally, the CA technology may be implemented by using a radio frequency circuit of a mobile device. Three types of carrier aggregation modes include intra-band contiguous CA, intra-band non-contiguous CA, and inter-band CA. Usually, the inter-band CA is applicable to a scenario of wide frequency spacing. Since frequency resources vary across global communications markets, the CA technology focuses on promoting the capability of a radio frequency circuit to support wider frequency spacing.

As shown in FIGS. 3A and 3B, the low-cost methods for selectively reducing switch loss can be combined with CA technology. For example, an inter-band CA type scenario can be used to transceive (i.e., transmit and receive) RF signals via Band Path 1 (associated with the first parallel connection) and via Band Path n (associated with the second parallel connection) with reduced insertion loss resulting from the low-cost methods for selectively reducing switch loss according to embodiments of this disclosure.

Figure 4:
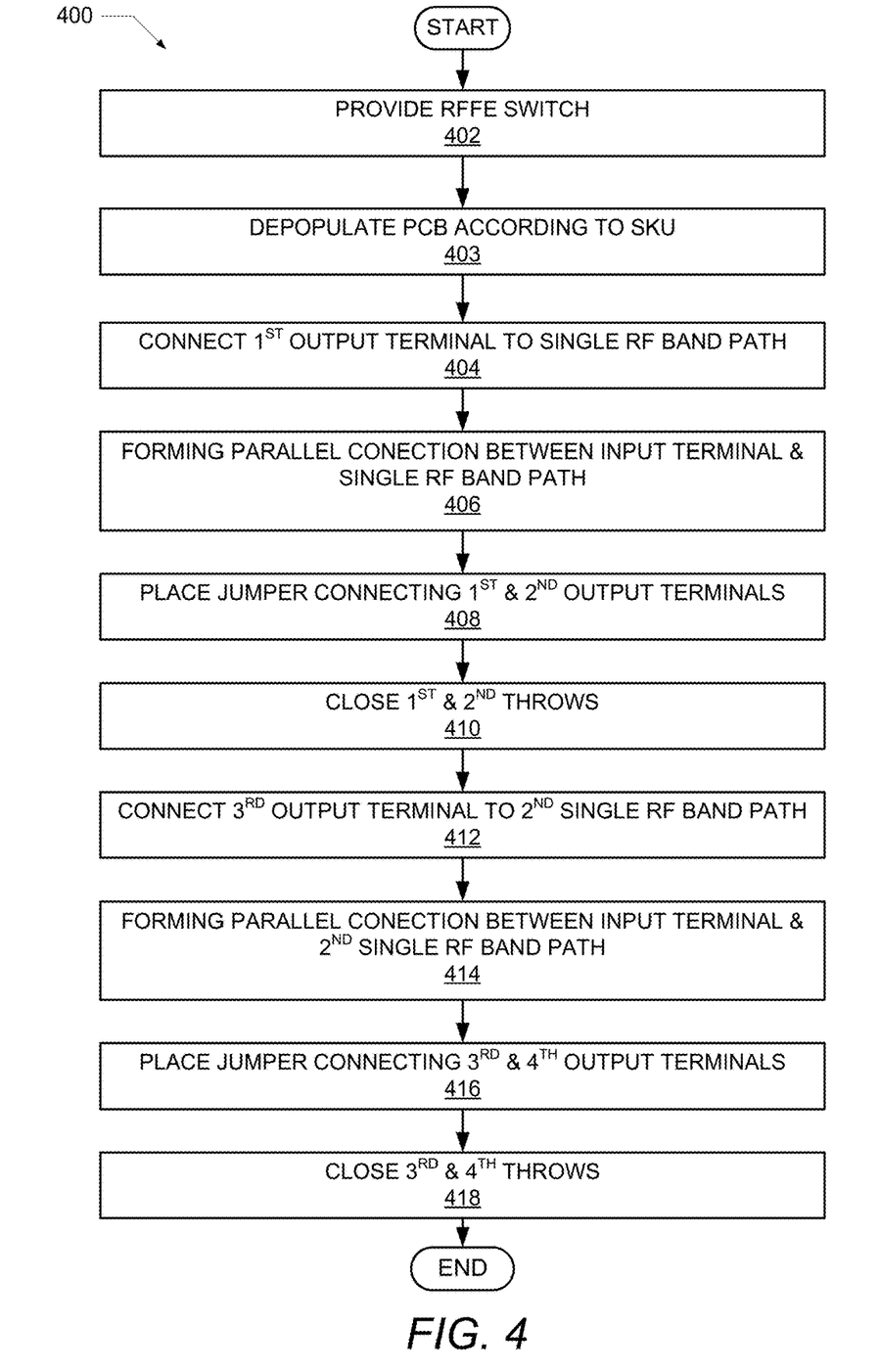
FIG. 4 is a flow chart illustrating low-cost methods for configuring an antenna switch and selectively reducing switch loss, in accordance with one or more embodiments.

With reference now to FIG. 4, there is illustrated an example method 400 for configuring an antenna switch and selectively reducing switch loss, in accordance with one or more embodiments. For example, the method 400 can be executed by manufacturing a PCB 200 (as shown in FIG. 2) and configuring it as shown in FIGS. 3A-3B. Method 400 begins at the start block, then proceeds to block 402. At block 402, method 400 includes providing an RFFE switch 210. For example, as shown in FIG. 2, single-product PCB 200 is provided, which includes RFFE switch 210 as a component. In at least one embodiment, RFFE switch 210 is provided, and then populated onto a PCB in order to complete formation of single-product PCB 200 of FIG. 2. At block 404, method 400 includes modifying PCB 200 of FIG. 2 to include only components required to support RF bands for a particular geographical region or a particular SKU. More particularly, at block 404, method 400 includes depopulating components from PCB 200 of FIG. 2 that are not requirements for the particular SKU. As shown in the example of FIG. 3A, PCB 200 is modified by depopulating (e.g., removing) second band-pass filter 212b, given that the first SKU does not require communications over the second RF band. As shown in the example of FIG. 3B, PCB 200 is modified by depopulating second band-pass filter 212b, fourth band-pass filter 212d, and fifth band-pass filter 212e, given that the second SKU does not require communications over the second, fourth, and fifth RF bands. At block 406, method 400 includes connecting a first output terminal to a single-carrier RF band path. For example, as shown in FIG. 3B, first output terminal 218a is connected to Band Path 1 at first band-pass filter 212a. At block 408, method 400 includes forming a parallel connection between the input terminal and the single-carrier RF band path. For example, as shown in FIG. 3B, a first parallel connection is formed between input terminal 216 and Band Path 1 at first output terminal 218a.

In at least one embodiment, the parallel connection can be formed by placing (at block 410) a jumper that connects the first output terminal to and an second additional output terminal, and by closing (at block 412) first and second throws of the RFFE switch, which correspond to the first output terminal and additional output terminal, respectively. For example, as shown in FIG. 3B, the first parallel connection is formed by placing jumper 302 between first output terminal 218a and second output terminal 218b and by closing first throw 220a and second throw 220b.

At block 414, method 400 includes connecting a third output terminal of the RFFE switch to a second single-carrier RF band path. For example, as shown in FIG. 3B, $N^{th}$ output terminal 218n is connected to Band Path n at $N^{th}$ band-pass filter 212n. At block 416, method 400 includes forming a second parallel connection between the input terminal and the second single-carrier RF band path. For example, as shown in FIG. 3B, a second parallel connection is formed between input terminal 216 and Band Path n at $N^{th}$ output terminal 218n.

In at least one embodiment, the second parallel connection can be formed by placing (at block 418) a jumper that connects the third output terminal to and an fourth additional output terminal, and by closing (at block 420) third and fourth throws of the RFFE switch, which correspond to the third output terminal and fourth additional output terminal, respectively. For example, as shown in FIG. 3B, the second parallel connection is formed by placing jumper 304a between $N^{th}$ output terminal 218n and fifth output terminal 218e and by closing $N^{th}$ throw 220n and fifth throw 220e. As another example, as shown in FIG. 3B, the second parallel connection is formed by connecting three terminals of jumper 304c to $N^{th}$ output terminal 218n and both of the fourth and fifth additional output terminals 218d and 218e and by closing $N^{th}$ throw 220n and both of the fourth and fifth throws 220d and 220e, which correspond to the additional output terminals 218d and 218e, respectively. The method 400 concludes at the end block.

In the above-described flowchart of FIG. 4, one or more of the method processes may be embodied in a computer readable device containing computer readable code such that a series of steps are performed when the computer readable code is executed on a computing device. In some implementations, certain steps of the methods are combined, performed simultaneously or in a different order, or perhaps omitted, without deviating from the scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object-oriented programming language, without limitation. These computer program instructions may be provided to a processor of a general purpose computer, special purpose computer, or other programmable data processing apparatus to produce a machine that performs the method for implementing the functions/acts specified in the flowchart and/or block diagram block or blocks. The methods are implemented when the instructions are executed via the processor of the computer or other programmable data processing apparatus.

As will be further appreciated, the processes in embodiments of the present disclosure may be implemented using any combination of software, firmware, or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device can include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

While the disclosure has been described with reference to example embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the scope thereof. Therefore, it is intended that the disclosure not be limited to the particular embodiments disclosed for carrying out this disclosure, but that the disclosure will include all embodiments falling within the scope of the appended claims.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   providing a radio frequency front end (RFFE) switch including a single pole input terminal and a number (N) of output terminals, each of the N output terminals being a component of a respective one of N throws of the RFFE switch, N being greater than one, the N output terminals including a first output terminal corresponding to a first throw of the N throws and at least one additional output terminal not connected to any radio frequency (RF) band path, the at least one additional output terminal including a second output terminal corresponding to a second throw of the N throws;
   connecting the first output terminal to a single RF band path; and
   forming a parallel connection between the single pole input terminal and the single RF band path, the parallel connection providing at least two parallel branches for routing RF signals being transceived between the single pole input terminal and the single RF band path.

2. The method of claim 1, wherein forming the parallel connection comprises:
   placing a jumper that connects the first output terminal to at least the second output terminal; and
   closing the first throw and the second throw.

3. The method of claim 2, wherein:
   the at least one additional output terminal comprises multiple additional output terminals and the jumper connects the first output terminal to multiple of the at least one additional output terminal; and
   the method further comprises: for each of the multiple additional output terminals to which the jumper connects, configuring a corresponding throw to form a branch of the parallel connection when the corresponding throw is closed.

4. The method of claim 2, wherein the jumper comprises at least one of: a zero (0) ohm resistor, a series resonant capacitor, or a parallel resonant inductor.

5. The method of claim 1, wherein:
   the single pole input terminal is connected to an antenna to enable transmission and reception of the RF signals via the antenna.

6. The method of claim 1, wherein:
   the N output terminals of the RFFE switch further comprise a third output terminal corresponding to a third throw of the N throws;
   the at least one additional output terminal includes a fourth output terminal corresponding to a fourth throw of the N throws; and
   the method further comprises:
      connecting the third output terminal to a second single RF band path; and
      forming a parallel connection between the single pole input terminal and the second single RF band path, the parallel connection providing at least two parallel branches for routing RF signals being transceived between the single pole input terminal and the second single RF band path.

7. A radio frequency front end (RFFE) switch comprising:
a single pole input terminal;
a number (N) of output terminals, each of the N output terminals being a component of a respective one of N throws of the RFFE switch, wherein:
N is greater than one,
the N output terminals include a first output terminal corresponding to a first throw of the N throws that connects to a single radio frequency (RF) band path, and at least one additional output terminal not connected to any RF band path, and
the at least one additional output terminal including a second output terminal corresponding to a second throw of the N throws; and
a parallel connection formed between the single pole input terminal and the single RF band path, the parallel connection providing at least two parallel branches for routing RF signals being transceived between the single pole input terminal and the single RF band path.

8. The RFFE switch of claim 7, wherein the parallel connection comprises:
the first throw and the second throw being closed; and
a jumper that connects the first output terminal to at least the second output terminal.

9. The RFFE switch of claim 8, wherein:
the at least one additional output terminal comprises multiple additional output terminals;
the jumper connects the first output terminal to multiple terminals from among the at least one additional output terminal; and
each of the multiple additional output terminals are a component of a respective throw that closes to form a branch of the parallel connection.

10. The RFFE switch of claim 8, wherein the jumper comprises at least one of: a zero (0) ohm resistor, a series resonant capacitor, or a parallel resonant inductor.

11. The RFFE switch of claim 7, wherein the single pole input terminal is connected to an antenna to enable transmission and reception of the RF signals via the antenna.

12. The RFFE switch of claim 7, wherein:
the N output terminals further comprise a third output terminal corresponding to a third throw of the N throws that connects to a second single RF band path;
the at least one additional output terminal includes a fourth output terminal corresponding to a fourth throw of the N throws; and
a parallel connection formed between the single pole input terminal and the second single RF band path, the parallel connection providing at least two parallel branches for routing RF signals being transceived between the single pole input terminal and the second single RF band path.

13. A communication device comprising:
a printed circuit board (PCB) including a number (N) of radio frequency (RF) signal paths for transmitting and receiving RF signals within respective single RF bands; and
a radio frequency front end (RFFE) switch positioned on and connected to the PCB, the RFFE switch comprising:
a single pole input terminal;
N output terminals, each of the N output terminals being a component of a respective one of N throws of the RFFE switch, wherein:
N is greater than one,
the N output terminals include a first output terminal corresponding to a first throw of the N throws that connects to a single RF band path of the PCB, and at least one additional output terminal not connected to any RF band path, and
the at least one additional output terminal including a second output terminal corresponding to a second throw of the N throws; and
a parallel connection formed between the single pole input terminal and the single RF band path, the parallel connection providing at least two parallel branches for routing RF signals being transceived between the single pole input terminal and the single RF band path.

14. The communication device of claim 13, wherein the parallel connection comprises:
the first throw and the second throw being closed; and
a jumper that connects the first output terminal to at least the second output terminal.

15. The communication device of claim 14, wherein:
the at least one additional output terminal comprises multiple additional output terminals;
the jumper connects the first output terminal to multiple terminals from among the at least one additional output terminal; and
each of the multiple additional output terminals are a component of a respective throw that closes to form a branch of the parallel connection.

16. The communication device of claim 14, wherein the jumper comprises at least one of: a zero (0) ohm resistor, a series resonant capacitor, or a parallel resonant inductor.

17. The communication device of claim 13, wherein the single pole input terminal of the RFFE switch is configured to connect to an antenna for transmission or reception of the RF signals via the antenna.

18. The communication device of claim 13, wherein, within the of the RFFE switch:
the N output terminals further comprise a third output terminal corresponding to a third throw of the N throws that connects to a second single RF band path;
the at least one additional output terminal includes a fourth output terminal corresponding to a fourth throw of the N throws; and
a parallel connection formed between the single pole input terminal and the second single RF band path, the parallel connection providing at least two parallel branches for routing RF signals being transceived between the single pole input terminal and the second single RF band path.

* * * * *